United States Patent [19]

Page

[11] 3,796,930

[45] Mar. 12, 1974

[54] THIN FILM HIGH VOLTAGE SWITCH

[75] Inventor: Derrick J. Page, Pittsburgh, Pa.

[73] Assignee: Westinghouse Electric Corporation, Pittsburgh, Pa.

[22] Filed: July 15, 1968

[21] Appl. No.: 745,039

[52] U.S. Cl. ......317/235 R, 317/235 B, 317/234 S, 317/235 D

[51] Int. Cl. ........................................ H01l 11/14

[58] Field of Search ................ 317/235, 234, 235 B

[56] References Cited

UNITED STATES PATENTS

| | | | |
|---|---|---|---|
| 3,191,061 | 6/1965 | Weimer | 307/88.5 |
| 3,433,677 | 3/1969 | Robinson | 136/89 |
| 3,402,331 | 9/1968 | Rittner | 317/235 |
| 3,423,821 | 1/1969 | Nishimura | 29/571 |

OTHER PUBLICATIONS

P. Weimer, Proceedings of the IRE, June 1962, pp. 1462–1469 relied on.

*Primary Examiner*—Martin H. Edlow
*Attorney, Agent, or Firm*—C. L. Menzemer

[57] ABSTRACT

This disclosure is concerned with a charge controlled high voltage switch. The switch is a gateless field effect transistor which can be switched with a positive, negative or alternating voltage. "Gateless" as used in this disclosure to describe a device, means a device which does not have a separate and distinct gate electrode.

6 Claims, 8 Drawing Figures

PATENTED MAR 12 1974 3,796,930

WITNESSES

Theodore F. Wrobel

James F. Young

INVENTOR

Derrick J. Page

BY

Frederick Shapoe

ATTORNEY

THIN FILM HIGH VOLTAGE SWITCH

CROSS REFERENCE

The semiconductor device of the invention is a simplified modification of the device taught in co-pending application Ser. No. 747,064, filed June 24, 1968, and now abandoned.

BACKGROUND OF THE INVENTION

1. Field of the Invention

The invention is concerned with a thin-film, gateless field effect transistor.

2. Description of the Prior Art

Conventional thin film field effect transistors will not switch a high voltage. If a high voltage, for example 40 volts or higher, is applied between the source and the drain of such a device, the thin film field effect transistor will fail in either one of two ways. They are, (1) a large amount of power will be dissipated in the semiconductor region resulting in a burn out; or (2) the gate control electrode, being at a potential approaching that of the source potential, causes a high field between the gate and drain which causes the gate electrode insulator to undergo dielectric breakdown.

In addition, prior art thin film field effect transistors are operated in either the first or third quadrant on the current-voltage characteristic but not both. If the device is n-type it will operate in the first quadrant, if it is p-type it will operate in the third quadrant.

An object of this invention is to provide a gateless thin film field effect transistor that has electrical characteristics which are similar in the first and third quadrants and which can be switched by a positive, negative or alternating voltage.

Another object of the present invention is to provide a gateless thin film field effect transistor which in the case of a p-type device is switched to the "on" state by applying a negative voltage, relative to the source electrode, to a metal substrate and to the "off" state by applying a positive voltage, relative to the source electrode, to the metal substrate.

Another object of the present invention is to provide a gateless thin film field effect transistor which in the case of an n-type device is switched to the "on" state by applying a positive voltage, relative to the source electrode, to a metal substrate and to the "off" state by applying a negative voltage, relative to the source electrode, to the metal substrate.

Other objects will, in part, be obvious and will, in part, appear hereinafter.

SUMMARY OF THE INVENTION

The semiconductor device of this invention is a gateless thin film field effect transistor which has a similar I–V characteristic in the first and third quadrant.

The device comprises a metal substrate which is electrically conductive and which may be flexible, semi-rigid, or rigid.

A first layer of an electrically insulating, thermal conducting material disposed on at least the top surface of the metal substrate.

A first electrode disposed on said first layer of electrically insulating, thermal conducting material.

A second electrode disposed on said first layer of electrically insulating, thermal conducting material and spaced apart from said first electrode.

A layer of a semiconductor material, either p- or n-type, disposed on said first layer of electrically insulating material between and in electrical and physical contact with said first and second electrodes.

A layer of an electrically insulating material disposed over the layer of semiconductor material.

BRIEF DESCRIPTION OF THE DRAWINGS

For a better understanding of the nature and objects of the invention, reference should be had to the following detailed description and drawings in which.

DESCRIPTION OF THE PREFERRED EMBODIMENT

Figure 1:
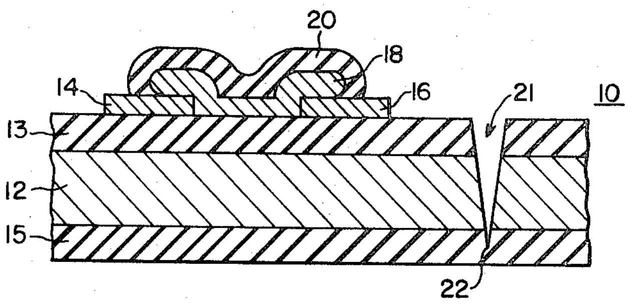
FIG. 1 is a side view, partially in cross-section, of a thin film field effect transistor of this invention.

With reference to FIG. 1, there is shown a thin film field effect transistor 10 which is the semiconductor device of this invention.

The transistor 10 consists of a substrate 12, layers of electrical insulating, thermal conducting material 13 and 15, a source contact or electrode 14, a drain contact or electrode 16, a layer of semiconductor material 18 and another layer of electrical insulation 20.

The substrate 12 may be flexible, semi-rigid or rigid and may consist of a foil, tape, wafer or body of metal selected from the group consisting of nickel, aluminum, copper, tin, molybdenum, tungsten, tantalum, beryllium, silver, gold, platinum, magnesium and base alloys of any of these, and ferrous base alloys, or the metalloid silicon.

The thickness of the substrate is not critical and it only need be thick enough to conduct an electrical current. A practical minimum thickness is 200A.

The layers 13 and 15 serve to electrically insulate the field effect transistor from the substrate and the substrate from any support or mounting means respectively. Layer 15 is optional depending on the support or mounting means employed.

Layers 13 and 15 are comprised of an electrically insulating thermal conducting material. The layers 13 and 15 may be an oxide of the metal comprising the substrate as for example aluminum oxide; an oxide of the metalloid silicon as for example silicon dioxide; beryllium oxide, titanium oxide; glasses such for example lead silicates, lead borates, lead borosilicates and mixtures thereof; and cured resins such for example as epoxy resins, polyester resins, silicon resins and polyurethane resins. The resins may be filled with up to about 20 percent, by weight, of 40 to 50 mesh electrical insulating, thermal conducting filler such for example anodized aluminum particles or beryllium oxide particles.

The thickness of layers 13 and 15, especially layer 13, depends on the operating voltage on the device. A thickness of 10,000 A of aluminum oxide has been found satisfactory for an operating voltage of 300 volts and a thickness of about 20,000 A of aluminum oxide has been found satisfactory for an operating voltage of 600 volts.

The source electrode 14 and drain electrode 16 are deposited upon the layer 13 and spaced apart from each other. The electrodes may be deposited by vapor deposition or silk screen techniques.

The source and drain electrodes, 14 and 16 respectively, may consist of any metal which forms an ohmic contact with the semiconductor material layer 18. Examples of suitable metals include gold, nickel, silver, indium, aluminum and base alloys thereof. Certain metals are preferred when using particular semiconductor materials for example, it is preferred to use either gold or nickel with tellurium and indium with either cadmium sulfide or cadmium selenide.

The source and drain electrodes should be thick enough to conduct the operating current of the device. Satisfactory devices have been made in which the source and drain electrodes have had a thickness of only 200 A., however some difficulty was experienced in making contact to these thin electrodes and a thickness of at least 1000 A. is preferred for this reason.

This distance between the source and drain electrodes is dependent on the desired operating conditions of the device. The shorter the distance between the source and drain electrodes the higher will be the "on"-"off" ratio (on/off) of the device. However, as the two are brought closer together the possibility of voltage breakdown and thermal burn out of the semiconductor layer 18 increases.

Satisfactory devices have been built in which the distance between the source and drain electrodes is 0.5 mils. For a 300 volt device a minimum preferred distance is one mil and if the distance between the source and drain exceeds 20 mils the on/off ratio drops to such a degree as to limit the usefulness of the device.

The geometry of the semiconductor material between the source electrode 14 and the drain electrode 16 governs the amount of current carried by the device. The thickness of insulation layer 13 controls the "turn-on-off-voltage" of the device.

The layer of semiconductor material 18 extends between the source electrode 14 and drain electrode 16. The layer 18 of semiconductor material is in contact with and extends between the source electrode 14 and drain electrode 16. Preferably the layer 18 partially overlaps the source electrode 14 and drain electrode 16. The layer 18 may consist of a semiconductor material of either p- or n-type, such for example as tellurium (p-type), cadmium sulfide (n-type), cadmium selenide (n-type), indium arsenide (n-type), gallium arsenide (n-type), tin oxide (n-type) and lead telluride (n- or p-type). The layer 18 may be single crystal or polycrystal or amorphous.

The thickness of the layer of semiconductor material may vary from an average thickness of about 40 A. to about 120 A. for tellurium and even higher for higher resistivity materials such as cadmium sulfide going up to 2000 A.

Since the semiconductor material is deposited by vapor deposition or silk screen techniques a layer of appreciably less than 40 A. thick would not be continuous enough to be a satisfactory current conductor.

If the layer 18 is too thick it would have too high a carrier density per square which in turn would require too high an electric field in the insulation layer 13 for the device to function.

Since all of the electrical insulators which are satisfactory for use in forming insulation layer 13, and which are set forth above, will breakdown at voltages of less than or about $10^7$ volts per centimeter, it has been found that the semiconductor layer 18 cannot have a carrier concentration exceeding $5 \times 10^{16}$ carriers per cubic centimeter.

For a narrow bandgap material such as tellurium (0.38ev) and indium arsenide (0.33ev) a thickness of about 50 A. approaches the maximum allowable carrier density while for the high bandgap materials such as cadmium selenide (1.7ev) and particulary cadmium sulfide (2.5 ev) the permissible thickness may be as high as 2000 A. The bandgap values given above are at 300° K.

The insulation layer 20 completely covers layer 18 of semiconductor material and seals it from the ambient.

The insulation layer 20 may be comprised of a suitable electrical insulating thermal conducting material selected from the group consisting of inorganic insulators such as silicon monoxide, silicon dioxide, aluminum oxide, calcium fluoride, magnesium fluoride and polymerizable organics such as polymers of hexachlorobutadiene, divinyl benezene, aryl sulfones, fluorinated alkenyls (e.g., polytetrafluoroethylene) and paraxylene.

A thickness of about 300 A. is the minimum thickness which will ensure a pin hole free isolation layer.

It is to be understood of course that a plurality of devices, an array of devices, may be fabricated on a single substrate and then separated into single devices or into groups of two or more devices on the same piece of substrate.

If two or more devices on the same piece of substrate are to employed together it may be necessary to electrically insulate one from the other. This can be accomplished by cutting a groove 21 through the substrate to a point 22 in the layer 15.

Figure 2:
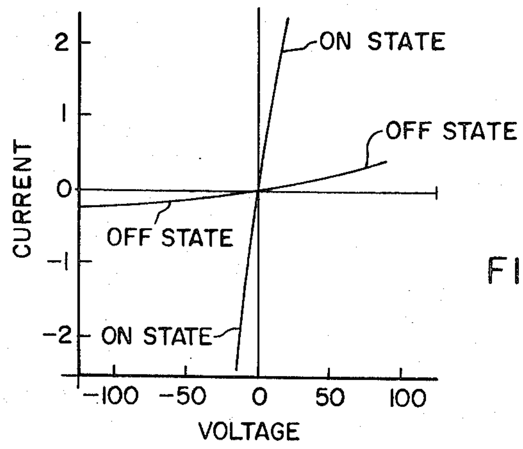
FIG. 2 is a typical current-voltage characteristic of the device of FIG. 1.

With reference to FIG. 2 there is shown a typical current-voltage characteristic for the device of FIG. 1.

It should be noted that the I–V characteristic, unlike those of a conventional thin film transistor, are similar in the first and third quadrants so that the device may be used to switch a positive, a negative or an alternating voltage.

If the layer of semiconductor material consists of a p-type material, as for example tellurium, the device is switched "on" by applying a negative bias, relative to the source electrode 14, to the substrate 12. A positive bias, relative to the source electrode 14, applied to the substrate 12 turns the device "off." Intermediate degrees of "on" or "off" can be obtained by applying a lesser bias, making the device suitable in analogue applications.

If the layer of semiconductor material 18 consists of an n-type material, as for example cadmium sulfide, the device is switched "on" by applying a positive bias, relative to the source electrode 14, to the substrate 12. A negative bias, relative to the source electrode 14, applied to the substrate 12 turns the device "off." Intermediate degrees of on or off can be obtained by applying a lesser bias as in the p-type material device.

Figure 3:
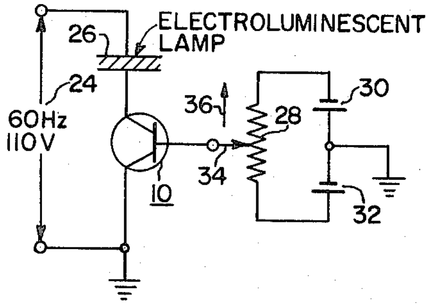
FIGS. 3 and 4 are schematic circuit diagrams showing utilization of the device of FIG. 1.
Figure 4:
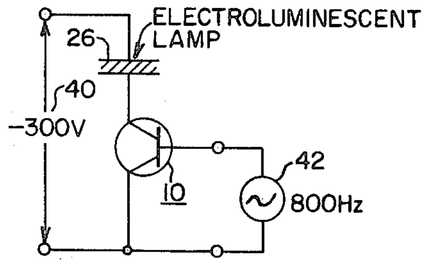

Two ways in which the device of this invention can be readily utilized as shown in FIGS. 3 and 4.

With reference to FIGS. 1 and 3 an A.C. 60 Hz, 110 volt supply 24 is connected in series circuit relationship with an electroluminescent lamp 26 and a p-type device like the device 10 of FIG. 1. The device 10 is in turn connected through the substrate 12 with a potentiometer 28 and back to back batteries 30 and 32 respectively. The device 10 is turned on by negatively biasing the substrate 12 of device 10 by moving tap 34 of potentiometer 28 in the direction of arrow 36. The electroluminescent lamp 26 can then be controlled by varying the bias. The bias can be made more negative by moving tap 34 of the potentiometer 28 in the direction of arrow 36 or the bias can be made less negative by moving tap 34 of potentiometer 28 in the direction of arrow 38. By making the bias on the substrate 12 positive the lamp 26 is turned off.

The brightness of an electroluminescent lamp increases with frequency. With reference to FIG. 4, by replacing the 60 Hz, 110 volt source 24 of FIG. 3 with a direct current 300 volt source 40 and driving the device 10 with an oscillator 42, at 800 Hz, it is possible to obtain a greatly increased efficiency from lamp 26. Efficiency being the ratio of brightness/power input.

The device 10 of FIG. 1 has been prepared by vacuum evaporation through metal stencils.

Broadly, the insulation coated metal substrate is disposed in a vacuum chamber, then a metal, for example gold or one of the other metals designated above, is evaporated through the stencil to form the source and drain electrodes. A second stencil is then substituted and a semiconductor material, such as tellurium or one of the other semiconductor materials listed above, is evaporated to form the semiconductor region which extends between the source and drain electrode. The stencil is again changed and an electrical insulation layer, as for example, a layer of silicon monoxide, is evaporated over the layer of semiconductor material to seal it from the ambient.

More specifically and assuming that the substrate is a metal foil or tape, the material for the substrate is selected and cut to size and shape. The versatility of the technique of this invention allows one to select a substrate of any size and shape desired. One preferred form is to employ a roll of substrate material with sprocket teeth disposed uniformly along its edge like photographic film.

The metal foil substrate with an anodized metal insulation layer or a cured resin insulating layer on a metal foil is first washed in methanol, dried with dry nitrogen, and baked in an oven for approximately 30 minutes at about 100°C.

The substrate is then cleaned-off with dry nitrogen after removal from the oven.

Figure 5:
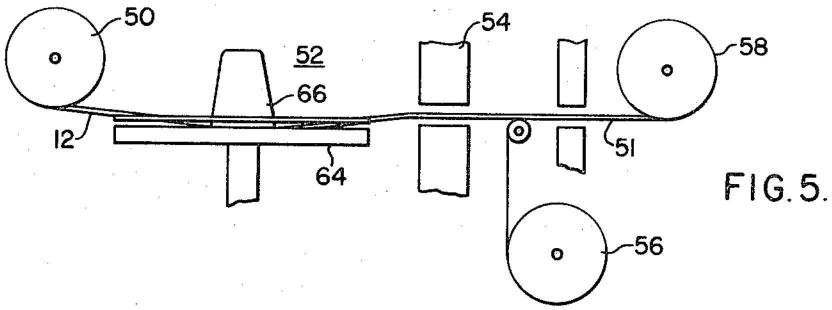
FIG. 5 is a side view of apparatus employed in practicing the teachings of this invention.
Figure 6:
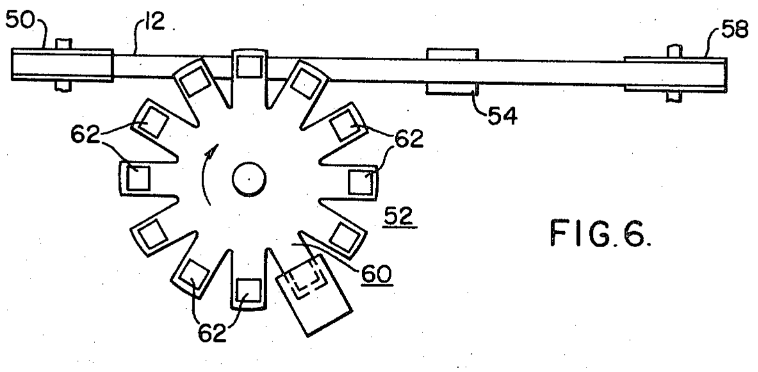
FIG. 6 is a top view of the apparatus of FIG. 5.

With reference to FIGS. 5 and 6, the cleaned substrate is then wound onto a feed reel 50, or other supply feed source, and disposed in a vacuum chamber.

By employing a leader 51 which may consist of a portion of the metal foil substrate itself or any other suitable material, such for example as a cellulose compound tape, the substrate 12 is disposed between components of a deposition station 52, a test station 54, a sealing component station 56 and a take-up reel 58.

The vacuum chamber is then pumped down to a pressure of less than $10^{-5}$torr and preferably less than $10^{-7}$torr.

The substrate 12 is then moved to bring into position an initial portion at the deposition station 52.

The deposition station 52 is comprised of a mechanical mask changing mechanism 60 upon which are positioned a series of masks 62, a thickness monitor 64, as for example, a micro-balance, an optical monitor or a resistance monitor system and a mechanical shutter mechanism 66 which is employed to control the starting and stopping of the deposition.

As the first portion of the substrate with the insulation layer 13 disposed thereon is positioned at the deposition station, the source and drain electrode mask is disposed over the substrate 12 and the source electrode 14 and drain electrode 16 (FIG. 1) are vapor deposited on the insulation layer 13.

Satisfactory devices have been made with a source and drain having a thickness of at least 200 A. and preferably about 1000 A. is formed by depositing the metal on the insulated substrate at a rate of about 0.1 A. to 50 A., and preferably from about 0.7 A. to 6 A., per second.

After the deposition of a sufficient thickness of the source and drain electrodes has been indicated by the monitoring system 64, a mechanical shutter mechanism 66 is activated to shut-off the metal vapor.

The mask changing mechanism 60 is then activated to index the next mask over the substrate and the layer 18 of either p- or n-type semiconductor material is vapor deposited between the source and drain electrodes.

Satisfactory devices have been made in which the layer of semiconductor material has a thickness of from 40 A. to 120 A. and preferably about 50 A. when the semiconductor material is tellurium, up to about 2000 A. for the wider bandgap materials as cadmium sulfide and cadmium selenide.

After completion of the deposition of the layer 18, the next mask is indexed into position and layer 20 of electrical insulation material is vapor deposited over the layer 18 of semiconductor material.

The layer 20 consists of an electrical insulating material for example, silicon monoxide, silicon dioxide, calcium fluoride magnesium fluoride, polymerized hexachlorobutadiene, polydivinyl benzene, poly paraxylene, and polytetrafluoroethylene, and also may comprise electrical insulating glass such as lead silicates, lead borates, lead borosilicates and mixtures thereof.

After the completion of the device or array of devices, the substrate is advanced and the sequence repeated whereby a plurality of devices or arrays of devices are formed one after another on the substrate.

It will be noted that the mechanical mask changing mechanism 60 contains more than the required three masks 62. The mechansim 60 in FIG. 4 contains twelve masks or four sets of the required three masks. As the mechanism 60 is rotated, each mask 62 passing under a cleaning head 63 where it is cleaned before reuse.

As the subsequent devices are prepared, the previously formed devices advance to the testing component 54 where their electrical characteristics are checked.

After being found to have satisfactory electrical characteristics, the device advances to the sealing component where it is sealed between a cellulose composition tape and the substrate, thus hermetically sealing the device and hence to the take-up reel 58 for storage.

Figure 7:
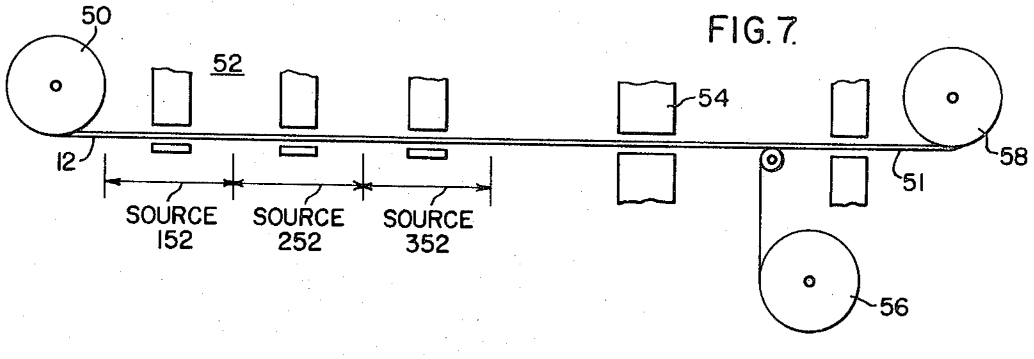
FIG. 7 is a side view of other apparatus employed in practicing the teachings of this invention.
Figure 8:
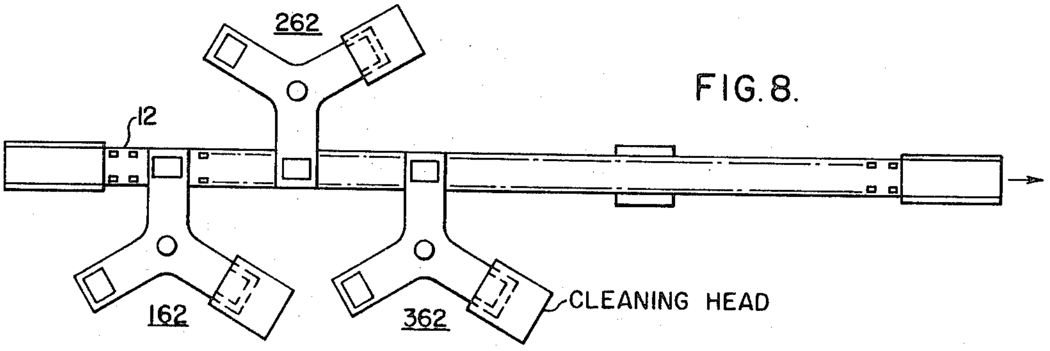
FIG. 8 is a top view of the apparatus of FIG. 7.

With reference to FIGS. 7 and 8, if desired, the deposition station 52 of FIGS. 5 and 6 may be divided into separate stations, and rather than indexing the various masks and vapor deposition sources over or under the substrate, the substrate is moved sequentially past, under or over the masks 162, 262, 362 and the vapor deposition material sources 152, 252, 352. There is a separate mask station and vapor deposition material source station for each vapor deposition.

It should be understood of course that the mask or masks and the vapor deposition source or sources may be positioned above or below the substrate as it passes through the vacuum chamber.

Essentially the same apparatus can be employed to form the device of this invention on wafers or bodies other than metal tapes or foils. In such a case the wafer or body is disposed on a leader of any suitable material and moved through a vacuum chamber and positioned under the various masks for the required depositions.

Since the device of this invention can be deposited on a silicon substrate, the device can be used with integrated circuits, being deposited directly on the same body as the IC circuit components.

While the invention has been described with reference to particular embodiments and examples it will be understood, of course, that modification, substitutions and the like may be made without departing from its scope.

I claim as my invention:

1. A thin film field effect transistor having similar first and third quadrant I–V characteristics consisting of:

1. a flexible electrically conductive metal supporting substrate,
2. a first layer of an electrically insulating, thermal conducting material disposed on at least the top surface of the metal substrate,
3. a first electrode disposed on said first layer of electrically insulating, thermal conducting material disposed on the top surface of said metal substrate,
4. a second electrode disposed on said first layer of electrically insulating, thermal conducting material disposed on the top surface of said metal substrate and spaced apart from said first electrode,
5. a layer of a semiconductor material disposed on said first layer of electrically insulating material between and in physical and electrical contact with said first and second electrodes, and
6. a layer of an electrically insulating material disposed over the layer of semiconductor material.

2. The device of claim 1 in which the substrate is a material selected from the group consisting of nickel, aluminum, copper, tin, molybdenum, tungsten, tantalum, beryllium, silver, gold, platinum, magnesium, base alloys thereof, ferrous base alloys and silicon.

3. The device of claim 1 in which the first and second electrode consists of a metal selected from the group consisting of gold, nickel, silver, indium, aluminum and base alloys thereof.

4. The device of claim 1 in which the layer of semiconductor material consists of a material selected from the group consisting of tellurium, cadmium sulfide, cadmium selenide, indium arsenide, gallium arsenide, tin oxide, and lead telluride.

5. The device of claim 1 in which:

1. the substrate consists of a material selected from the group consisting of nickel, aluminum, copper, tin, molybdenum, tungsten, tantalum, beryllium, silver, gold, platinum, magnesium, base alloys thereof, ferrous base alloys, and silicon,
2. the first layer of an electrically insulating, thermal conducting material consists of a material selected from the group consisting of; metal oxides, glass, cured resins and cured filled resins;
3. the first and second electrodes consists of a metal selected from the group consisting of gold, nickel, silver, indium, aluminum and base alloys thereof; and
4. the layer of semiconductor material consists of a material selected from the group consisting of tellurium, cadmium sulfide, cadmium selenide, indium arsenide, gallium arsenide, tin oxide.

6. The device of claim 1 in which the substrate is aluminum, the first insulating layer is aluminum oxide, and the semiconductor material is tellurium.

* * * * *